United States Patent
Keränen et al.

(10) Patent No.: US 11,388,262 B2
(45) Date of Patent: Jul. 12, 2022

(54) COMPRESSION CONTEXT SETUP FOR DATA TRANSMISSION FOR IOT DEVICES

(71) Applicant: Telefonaktiebolaget LM Ericsson (publ), Stockholm (SE)

(72) Inventors: Ari Keränen, Helsinki (FI); Gonzalo Camarillo Gonzalez, Helsinki (FI)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/958,446

(22) PCT Filed: Dec. 29, 2017

(86) PCT No.: PCT/EP2017/084843
§ 371 (c)(1),
(2) Date: Jun. 26, 2020

(87) PCT Pub. No.: WO2019/129368
PCT Pub. Date: Jul. 4, 2019

(65) Prior Publication Data
US 2021/0058477 A1  Feb. 25, 2021

(51) Int. Cl.
*H04L 29/08* (2006.01)
*H04L 29/06* (2006.01)
(Continued)

(52) U.S. Cl.
CPC .......... *H04L 67/5651* (2022.05); *H04L 67/02* (2013.01); *H04L 67/1097* (2013.01); *H04L 69/04* (2013.01); *H04W 52/0225* (2013.01)

(58) Field of Classification Search
CPC . H04L 67/2828; H04L 67/02; H04L 67/1097; H04L 69/04; H04W 52/0225
(Continued)

(56) References Cited

U.S. PATENT DOCUMENTS 8,499,248 B1 * 7/2013 Keel ................. G06F 3/0482
715/762
2002/0178178 A1 * 11/2002 Peng ................. G06F 16/9574
(Continued)

FOREIGN PATENT DOCUMENTS

EP     2961229 A1   12/2015
WO   WO 2011057154 A1   5/2011
WO   WO 2018054463 A1   3/2018

OTHER PUBLICATIONS

Yonghua Song, An Internet of Energy Things Based on Wireless LPWAN, Aug. 1, 2017, ScienceDirect, Retrieved via URL: https://www.sciencedirect.com/science/article/pii/S2095809917306057 (Year: 2017).*

(Continued)

*Primary Examiner* — Schquita D Goodwin
(74) *Attorney, Agent, or Firm* — Sage Patent Group (57) ABSTRACT

A method or enabling compression context setup for Internet-of-Thing, IoT, devices in a communication network is presented. The method is performed in an application server node for IoT devices, and includes sending a get context message to a gateway node, the get context message requesting a compression context setup includes compression details for an IoT device, receiving an indication of the requested compression context setup for the IoT device from the gateway node, and compressing and decompressing messages sent to and from the IoT device based on the received indication. An IoT device, a gateway node, an application node, a computer program and a computer program product thereof are also presented.

18 Claims, 5 Drawing Sheets

(51) Int. Cl.
*H04W 52/02* (2009.01)
*H04L 67/5651* (2022.01)
*H04L 67/02* (2022.01)
*H04L 67/1097* (2022.01)
*H04L 69/04* (2022.01)

(58) Field of Classification Search
USPC .......................................................... 709/203
See application file for complete search history.

(56) References Cited

U.S. PATENT DOCUMENTS

| | | | | |
|---|---|---|---|---|
| 2011/0249610 | A1* | 10/2011 | Ho | H04W 28/06 370/315 |
| 2013/0322346 | A1* | 12/2013 | Comeau | H04W 72/0406 370/329 |
| 2014/0126581 | A1* | 5/2014 | Wang | H04L 41/0806 370/431 |
| 2015/0382235 | A1* | 12/2015 | Min | H04W 52/0251 370/230 |
| 2016/0164728 | A1* | 6/2016 | Chakrabarti | H04L 41/0806 370/254 |
| 2017/0093700 | A1* | 3/2017 | Gilley | H04L 63/20 |
| 2017/0237835 | A1* | 8/2017 | Savolainen | H04L 69/04 709/245 |
| 2017/0329677 | A1* | 11/2017 | Crofton | G06F 16/2455 |
| 2018/0014225 | A1* | 1/2018 | Yang | H04L 69/22 |
| 2018/0150517 | A1* | 5/2018 | Merker | G06F 16/24554 |
| 2018/0338017 | A1* | 11/2018 | Mekuria | H04L 67/1097 |
| 2019/0116483 | A1* | 4/2019 | Ryu | H04W 68/02 |
| 2019/0132738 | A1* | 5/2019 | Zhang | H04L 63/101 |
| 2019/0140939 | A1* | 5/2019 | Schooler | G06K 9/6292 |
| 2019/0297662 | A1* | 9/2019 | Palat | H04W 76/27 |
| 2020/0022022 | A1* | 1/2020 | Ly | H04W 28/06 |
| 2020/0196186 | A1* | 6/2020 | Gupta | H04W 28/0289 |
| 2020/0314944 | A1* | 10/2020 | Liu | H04W 76/25 |

OTHER PUBLICATIONS

Suk Kyu Lee, Future of IoT Networks: A Survey, Oct. 16, 2017, Multidisciplinary Digital Publishing Institute, Retrieved via URL: https://www.mdpi.com/2076-3417/7/10/1072 (Year: 2017).*

Khaled Abdelfadeel, LSCHC: Layered Static Context Header Compression for LPWANs, Oct. 20, 2017, URL retrieved via: https://dl.acm.org/doi/abs/10.1145/3124087.3124092 (Year: 2017).*

A. Minaburo, LP-WAN Compression Context draft-toutain-lp-wan-compression-context-00, Apr. 19, 2016, URL retrieved via: https://datatracker.ietf.org/doc/html/draft-toutain-lp-wan-compression-context-00 (Year: 2016).*

International Search Report and Written Opinion of the International Searching Authority, PCT/EP2017/084843, dated Jun. 26, 2018, 14 pages.

Minaburo, et al. "Static Context Header Compression (SCHC) for the Constrained Application Protocol (CoAP)," RFC 8824, Internet Engineering Task Force (IETF), ISSN: 2070-1721, Universidad de Buenos Aires, Jun. 2021, 22 pages.

* cited by examiner

COMPRESSION CONTEXT SETUP FOR DATA TRANSMISSION FOR IOT DEVICES

CROSS REFERENCE TO RELATED APPLICATIONS

This application is a 35 U.S.C. § 371 national stage application of PCT International Application No. PCT/EP2017/084843 filed on Dec. 29, 2017, the disclosures and content of which is incorporated by reference herein in its entirety.

TECHNICAL FIELD

The invention relates to methods for enabling compression context setup for IoT devices in a communication network, and devices, nodes, computer programs and computer program products thereof.

BACKGROUND

A large number of Internet-of-Thing (IoT) devices will in the near future connect to a cellular network using Low Power Wide Area (LPWA) radio networks such as the NarrowBand (NB)-IoT network. Many of these IoT devices will use the Non-Internet Protocol (IP) Data Delivery (NIDD) service to connect with the Service Capability Exposure Function (SCEF). The SCEF is located in the cellular network and acts as a gateway towards an IoT controller. The interface between the SCEF and the IoT controller can be a REpresentational State Transfer (REST)-based interface.

3rd Generation Partnership Project (3GPP) networks can use the Robust Header Compression (RoHC) protocol for IP header compression over the radio link. The Static Context Header Compression (SCHC) technique has been proposed as a compression mechanism for LPWA Networks (LP-WANs), including NB-IoT networks.

SUMMARY

An object of embodiments presented herein is to enable a compression context setup for data transmissions, between an IoT device and an application server, in a communication network.

According to a first aspect, there is provided a method for enabling compression context setup for Internet-of-Thing (IoT) devices in a communication network. The method is performed in an application server node for IoT devices and comprises sending a get context message to a gateway node, the get context message requesting a compression context setup comprising compression details for an IoT device, receiving an indication of the requested compression context setup for the IoT device from the gateway node, and compressing and decompressing messages sent to and from the IoT device based on the received indication.

The received indication may comprise a pointer to a context storage node storing compression details for the IoT device, and the method may further comprise sending a get context message to the context storage in response to the received indication, and receiving a compression context setup for the IoT device in response to the get context message sent to the context storage. The pointer may be a Uniform Resource Locator (URL) to the context storage. The compression context setup may comprise application layer compression details for the IoT device.

The received indication may comprise the requested compression context setup for the IoT device. The compression context setup may comprise Internet Protocol (IP) layer compression details for the IoT device. The IP layer compression details may be retrieved from a core network node.

The communication network may comprise a Low Power Wide Area (LPWA) network.

According to a second aspect, there is presented a method for enabling compression context setup for IoT devices in a communication network. The method is performed in an IoT device and comprises establishing a compression context setup for the IoT device, and compressing and decompressing messages sent to and from an application server for IoT devices based on the established compression context setup.

The establishing step may comprise sending a pointer to a gateway node, which pointer points to a context storage comprising the established context setup for the IoT device. The pointer may be an URL to the context storage. The compression context setup may comprise application layer compression details for the IoT device.

The establishing step may comprise attaching to a core network node. The compression context setup may comprise IP layer compression details.

The communication network may comprise an LPWA network.

According to a third aspect, there is presented a method for enabling compression context setup for IoT devices in a communication network. The method is performed in a gateway node for IoT devices and comprises receiving a get context message from an application server node, the get context message requesting a compression context setup comprising compression details for an IoT device, and sending an indication of the requested compression context setup for the IoT device to the application server node.

The received get context message may request application layer compression details for the IoT device, and the method may further comprise receiving a pointer from the IoT device, wherein the pointer points to a context storage node storing the application layer compression details for the IoT device.

The received get context message may request IP layer compression details for the IoT device, and the method may further comprise sending a get context message to a core network node, and receiving IP layer compression details for the IoT device in response to the sent get context message, and wherein the sent indication comprises the received IP layer compression details.

The communication network may comprise an LPWA network.

According to a third aspect, there is presented an application server node for enabling compression context setup for IoT devices in a communication network. The application server node comprises a processing circuitry, and a computer program product storing instructions that, when executed by the processing circuitry, causes the application server node to send a get context message to a gateway node, the get context message requesting a compression context setup comprising compression details for an IoT device, to receive an indication of the requested compression context setup for the IoT device from the gateway node, and to compress and decompress messages sent to and from the IoT device based on the received indication.

The received indication may comprise a pointer to a context storage node storing compression details for the IoT device, and the application server node may further be caused to send a get context message to the context storage in response to the received indication, and to receive a compression context setup for the IoT device in response to the get context message sent to the context storage. The pointer may be an URL to the context storage. The compression context setup may comprise application layer compression details for the IoT device.

The received indication may comprise the requested compression context setup for the IoT device. The compression context setup may comprise IP layer compression details for the IoT device. The IP layer compression details are retrieved from a core network node.

The communication network may comprise an LPWA network.

According to a fourth aspect, there is presented an IoT device for enabling compression context setup for IoT devices in a communication network. The IoT device comprises a processing circuitry and a computer program product storing instructions that, when executed by the processing circuitry, causes the IoT device to establish a compression context setup for the IoT device, and to compress and decompress messages sent to and from an application server for IoT devices based on the established compression context setup.

The establish step may cause sending a pointer to a gateway node, which pointer points to a context storage comprising the established context setup for the IoT device. The pointer may be an URL to the context storage. The compression context setup may comprise application layer compression details for the IoT device.

The establish step may comprise attaching to a core network node. The compression context setup may comprise IP layer compression details.

The communication network may comprise an LPWA network.

According to a fifth aspect, there is presented a gateway node for enabling compression context setup for IoT devices in a communication network. The gateway node comprises a processing circuitry, and a computer program product storing instructions that, when executed by the processing circuitry, causes the gateway node to receive a get context message from an application server node, the get context message requesting a compression context setup comprising compression details for an IoT device, and to send an indication of the requested compression context setup for the IoT device to the application server node.

The received get context message may request application layer compression details for the IoT device, and the gateway node may further be caused to receive a pointer from the IoT device, wherein the pointer points to a context storage node storing the application layer compression details for the IoT device. The received get context message may request IP layer compression details for the IoT device, and the gateway node may further be caused to send a get context message to a core network node, and to receive IP layer compression details for the IoT device in response to the sent get context message, wherein the sent indication comprises the received IP layer compression details.

The communication network may comprise an LPWA network.

According to a sixth aspect, there is presented an application server node for enabling compression context setup for IoT devices in a communication network. The application server node comprises a communication manger for sending a get context message to a gateway node, the get context message requesting a compression context setup comprising compression details for an IoT device, and for receiving an indication of the requested compression context setup for the IoT device from the gateway node, and a determination manger for compressing and decompressing messages sent to and from the IoT device based on the received indication.

According to a seventh aspect, there is presented an IoT device for enabling compression context setup for IoT devices in a communication network. The IoT device comprises a determination manger for establishing a compression context setup for the IoT device and for compressing and decompressing messages sent to and from an application server for IoT devices based on the established compression context setup.

According to an eight aspect, there is presented a gateway node for enabling compression context setup for IoT devices in a communication network. The gateway node comprises a communication manger for receiving a get context message from an application server node, the get context message requesting a compression context setup comprising compression details for an IoT device, and for sending an indication of the requested compression context setup for the IoT device to the application server node.

According to a ninth aspect, there is presented a computer program for enabling compression context setup for IoT devices in a communication network. The computer program comprises computer program code which, when run on an application server node causes the application server node to send a get context message to a gateway node, the get context message requesting a compression context setup comprising compression details for an IoT device, to receive an indication of the requested compression context setup for the IoT device from the gateway node, and to compress and decompress messages sent to and from the IoT device based on the received indication.

According to a ninth aspect, there is presented a computer program for enabling compression context setup for IoT devices in a communication network. The computer program comprises computer program code which, when run on an IoT device, causes the IoT device to establish a compression context setup for the IoT device, and to compress and decompress messages sent to and from an application server for IoT devices based on the established compression context setup.

According to a tenth aspect, there is presented a computer program for enabling compression context setup for IoT devices in a communication network. The computer program comprising computer program code, which when run on a gateway node, causes the gateway node to receive a get context message from an application server node, the get context message requesting a compression context setup comprising compression details for an IoT device, and to send an indication of the requested compression context setup for the IoT device to the application server node.

A computer program product comprising a computer program and a computer readable storage means on which the computer program is stored is also presented.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Low-Power Wide-Area (LPWA) networks, such as the NarrowBand (NB)-Internet-of-Thing (IoT) network, provide a relatively low amount of bandwidth for connected IoT devices. At the same time, Internet Protocol (IP)-based IoT protocols are often not optimized for low-bandwidth links. Using IoT protocols over LPWA networks can be wasteful in terms of the amount of traffic transmitted and the energy spent transmitting traffic.

Currently the Robust Header Compression (RoHC), as specified in the 3rd Generation Partnership Project (3GPP), and the Static Context Header Compression (SCHC), as defined by the Internet Engineering Task Force (IETF), protocols need to be implemented in both the IoT device and in the cellular network to work, and they cannot be used by the IoT devices unless the terminating network element in the cellular network supports it. RoHC is also computationally heavy and requires a context learning phase to function. SCHC doesn't have a context learning phase but requires an out-of-band mechanism for context delivery.

In order to reduce the amount of traffic transmitted over a LPWA network, a mechanism is presented to establish an IP capable compression context between an IoT controller, or application server, and an IoT device. Such a context allows the use of traffic compression techniques such as SCHC without implementing SCHC in the cellular network.

Two mechanisms for context setup are presented:

1) A context pointer for retrieving context information from a server, storing compression contexts. The context is preconfigured before any network connection is set up, e.g., part of firmware or manually configured.

2) A gateway interface, exemplified with the SCEF, for discovering a virtual IP address assignment for the IoT device.

Note that a static context is intended herein, compared to a dynamic context. That is, the information making up the context is not learned during packet exchanges. Instead, the information is defined previously, before any traffic is actually exchanged. Consequently, the context is known by both the IoT device and the IoT controller before any data transmission is performed.

Using compression techniques typically saves bandwidth and energy on the LPWA access network, and also on the cellular network and on the communication network between the SCEF and the IoT controller. Compressed data transmissions are typically also faster, i.e. transmission savings more than compensate for compression and decompression overheads.

The presented embodiments do not require any direct communication between the application server and the IoT device and hence saves bandwidth and expedites the context setup.

IoT devices are presented herein, but the same method may be applicable also for machine devices.

Figure 1:
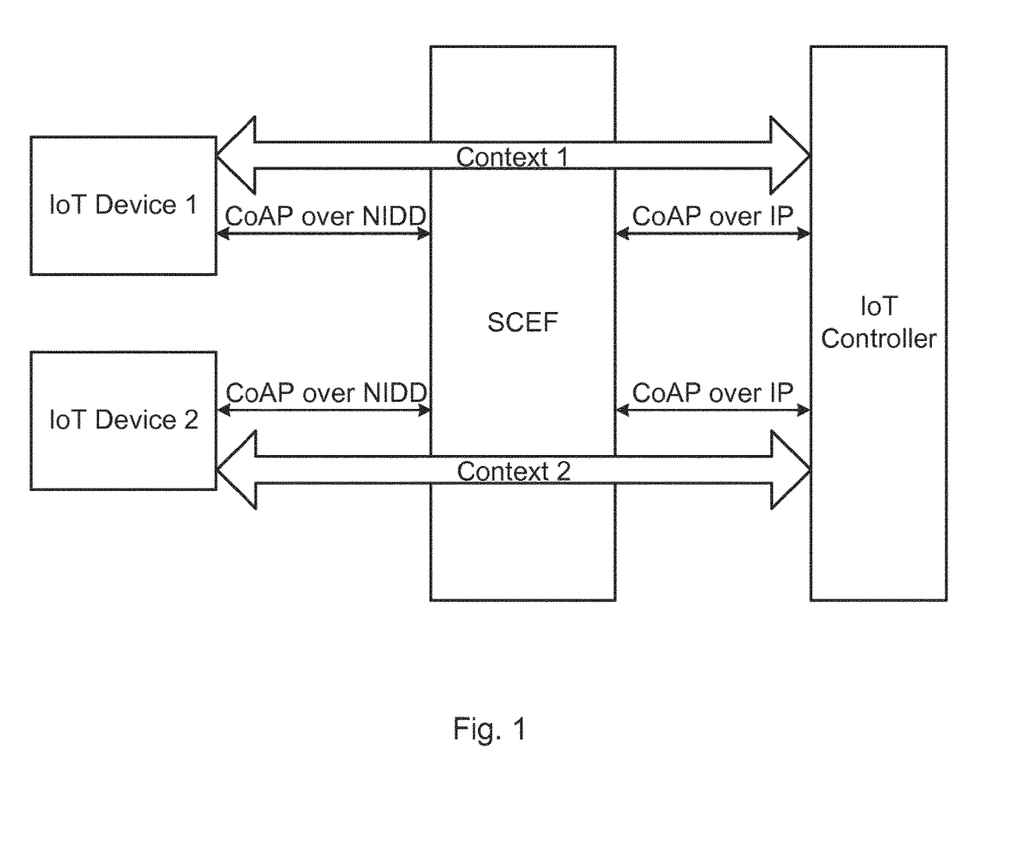
FIG. 1 is a schematic illustration of compressed traffic based on shared context according to an embodiment presented herein.

Communication using a compression context in a communication network is generally presented with reference to FIG. 1.

An IoT device 1 has been enrolled in the IoT controller. In this process, the IoT controller gets credentials that it can use to prove it is the legitimate controller for the IoT device 1 and the IoT device 1 can also prove that it is allowed to connect to the IoT controller. An IoT device 2 has also been enrolled in the IoT controller in a similar way. An IoT device owner may e.g. insert information he received in connection with a purchase of an IoT device to an IoT controller user interface, wherein the information contain a shared secret that only a legitimate owner and the IoT device are aware of. Other methods, such as X.509 certificates issued by the IoT device manufacturer may be used for the same purpose.

When the IoT devices are started and join an LPWA network, such as a NB-IoT network, they can indicate in the registration procedure that they are able to use a compression context setup mechanism described herein. This information may for example be part of the subscription type stored in a Home Subscriber Server (HSS) or may be indicated in an extension for the registration signalling. Alternatively, such information may be established out of band, e.g., as part of the enrolment configuration.

When the IoT devices send data with compressed IP and/or over an application layer, e.g., Non-IP Data Delivery (NIDD), via a cellular gateway, here a SCEF, they include the IP and application layer headers (such as Constrained Application Protocol (CoAP) headers) in the data and then apply the SCHC compression (using the preconfigured context) for the whole packet. The compressed packet is sent over the NIDD. The IoT controller receives the packet with compressed IP and/or over an application layer (e.g. CoAP) over HTTP (i.e. over IP), which is not decompressable by the SCEF, and is able to decompress the headers using the shared, preconfigured, context. After this step, the IoT controller can act on the packet as if it was a normal IPv6 packet. The same procedure of compression and decompression is repeated for return traffic.

The IoT device 1 and the IoT device 2 both communicate through the same gateway, but may have different compression contexts, context 1 and context 2, respectively.

The IoT device may for example be a temperature sensor sending current temperature readings of a room for climate control purpose. The IoT device may e.g. be a valve controller controlling the flow of liquid in an industrial process and receiving updates on a desired state of the valve. The IoT device may e.g. be a vibration sensor attached to an industrial machinery that sends vibration statistics to IoT controller for analysis to facilitate preventive maintenance.

Two different compression context setup processes are presented: IP context with IP layer compression details, and application context with application layer compression details.

Figure 2:
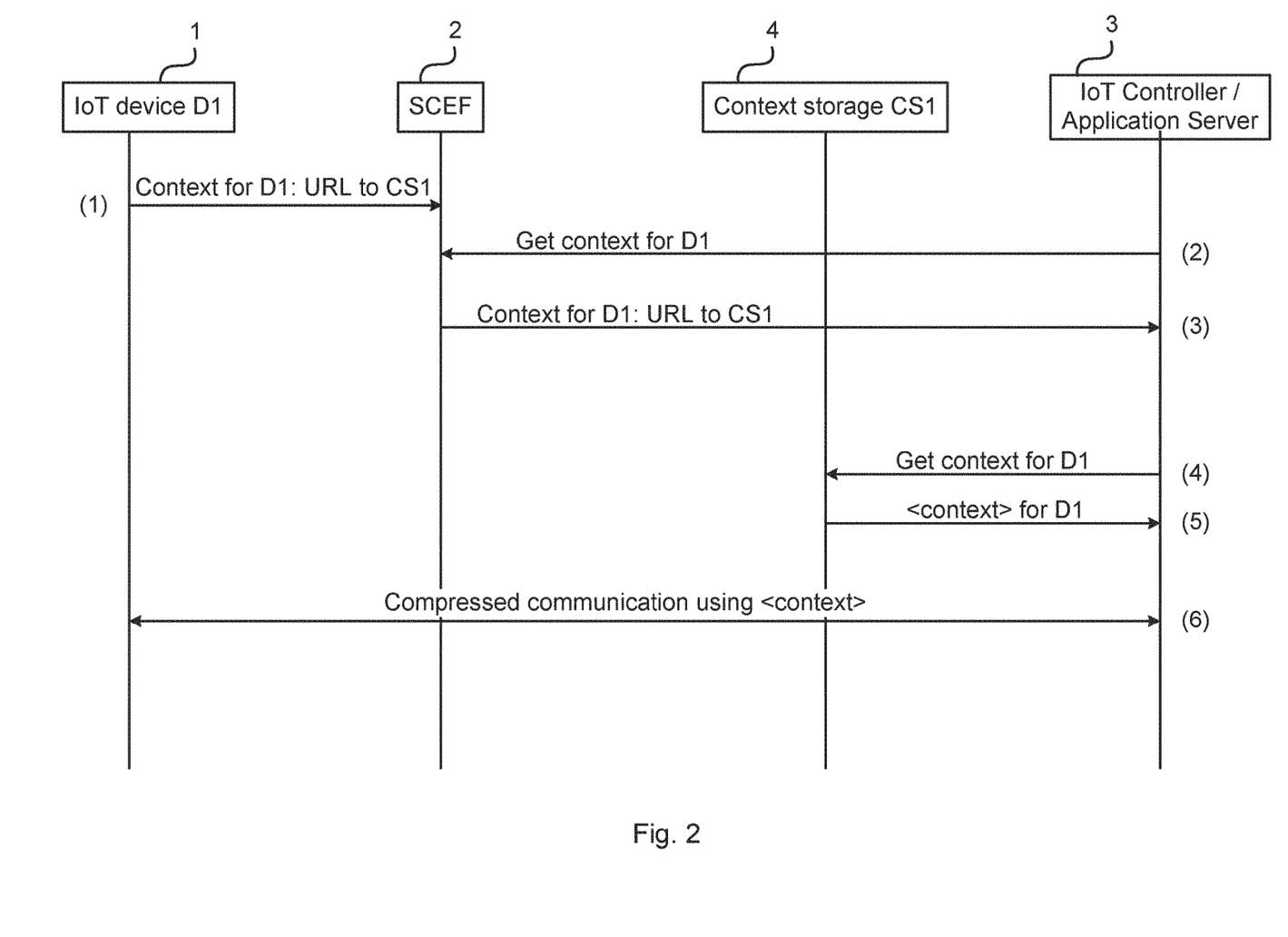
FIG. 2 is a schematic signalling diagram for setting up compression context in a communication network according to an embodiment presented herein.

An embodiment for compression context setup enabling application layer compression context is presented with reference to FIG. 2.

Before communication is initiated, a context storage 4, CS1, has stored compression context for an IoT device 1, D1. The CS1 may e.g. be owned by the manufacturer of D1 and the manufacturer can then insert the compression context in firmware of D1 and also into a database of CS1. Alternatively, CS1 may be owned by an operator who is aggregating information from many manufacturers so that each of them do not have to host their own context storage, in which case manufacturers would send relevant context information to CS1 when they produce new devices.

In the first step 1, the context for D1 is by D1 presented as pointer to the CS1. The pointer may be in the form of a Uniform Resource Locator (URL). Alternatively, the pointer may be another identifier for a database, particularly if CS1 is a distributed database. The first step 1 may be an explicit signalling step, it may be part of a network attachment procedure, or it may be done out of band. Common for these alternatives is that a cellular network gateway 2, here exemplified as a SCEF, becomes aware of the pointer, URL, to the context storage CS1.

In the second step an IoT controller or application server 3 may, send a request for a compression context for D1 to the SCEF 2, and in step 3 receives a pointer for D1 context and/or service type specific context. If the SCEF 2 does not yet have such context information for the D1, it requests it from D1. The SCEF 2 may store the information for future requests.

The application server 3 may learn about an identifier for D1 out of band (it may be International Mobile Equipment Identity (IMEI), International Mobile Subscriber Identity (IMSI), or any other ID connected to D1 such as credentials from D1 in the form of a fingerprint of a public key). In steps 4 and 5 the application server 3 retrieves the context from CS1, using the received pointer to CS1. The context pointer retrieved from SCEF may also need to contain integrity check values, since the context is retrieved from an external node.

In step 6 the retrieved context is used for compressed communication between D1 and the application server 3.

The process has bee described as initiated by the application server, but alternatively D1 may initiate the process. In case D1 initiates the process, and the application server then realizes that it does not have the context for the communication, the above presented process is initiated.

Figure 3:
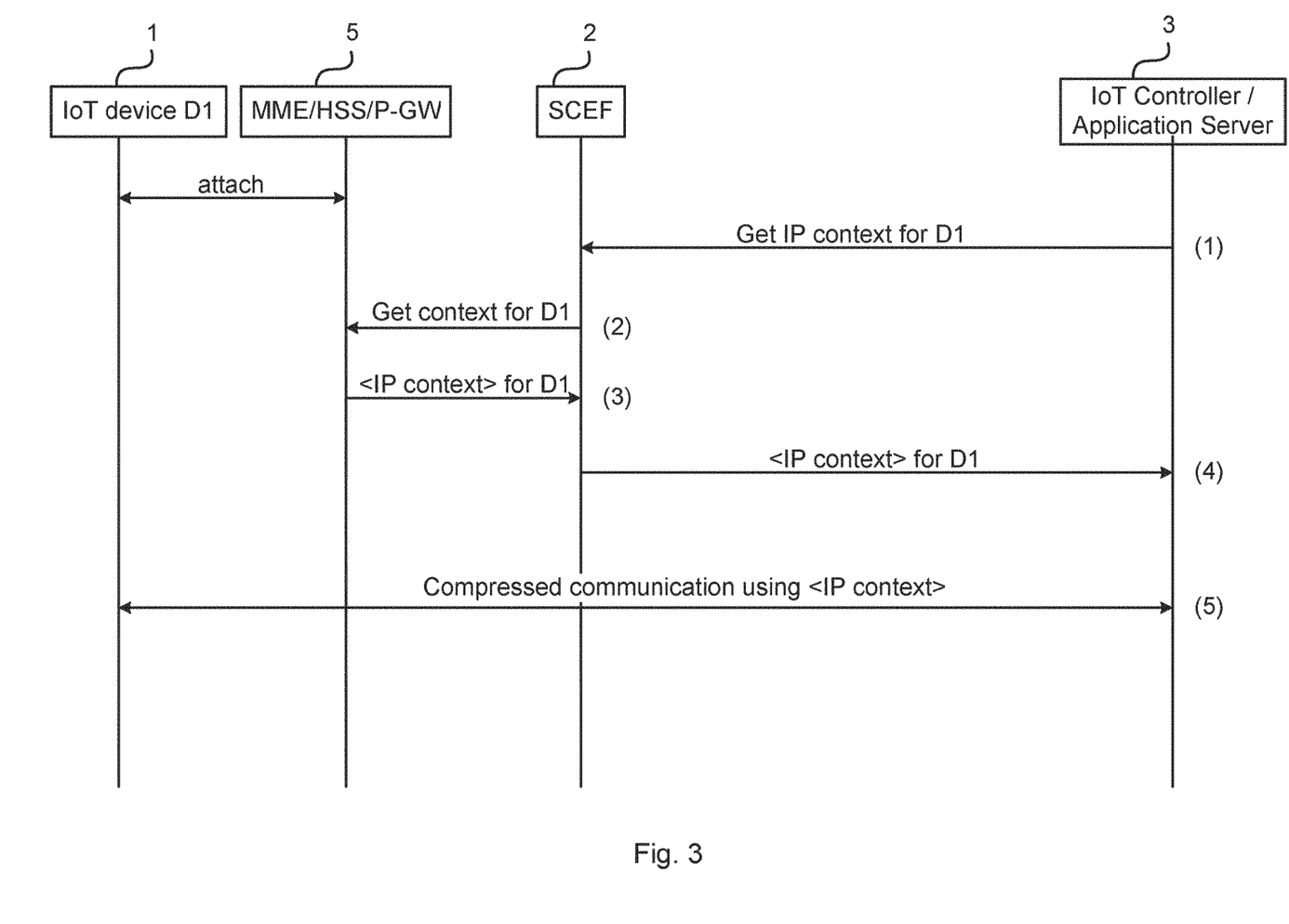
FIG. 3 is a schematic signalling diagram of for setting up compression context in a communication network according to an embodiment presented herein.

An embodiment for compression context setup enabling IP layer compression context is presented with reference to FIG. 3.

An IoT device 1, D1, need to attach to a cellular network to be able to be reached. During a regular attach procedure IP context for D1 will be stored in the core network 5 of the cellular network. The IP context may e.g. be stored in a Mobility Management Entity (MME), an HSS or a Packet Data Network gateway (P-GW) of a 3GPP core network.

In step 1 the application server 3 requests IP context information for D1 from an IoT gateway interface 2, here exemplified with a SCEF. The application server 3 may learn about an identifier for D1 out of band (it may be International Mobile Equipment Identity (IMEI), International Mobile Subscriber Identity (IMSI), or any other ID connected to D1).

In steps 2 and 3 the SCEF retrieves this information from the core network 5. A dynamic IP address configuration may e.g. be retrieved from an MME, and a static IP address configuration may e.g. be retrieved from the HSS.

The retrieved IP address configuration, or IP context, for D1 is returned to the application server 3 in step 4. The IP address configuration is used for the compression context to eliminate IP address information from IP packets during data transmissions.

Step 5 corresponds to step 6 in FIG. 2.

The compression context may comprise information about static fields, dynamic fields and their change pattern in protocol headers. This information is used by a compressor to compress the packet as efficiently as possible and then by a decompressor to decompress the packet to its original state.

In a connected car a set of tyre pressure sensors (i.e. IoT devices) may report pressure data to an IoT controller. For high availability, each of the sensors may be directly connected with NB-IoT, but since the sensors are battery-powered and may want to optimize power consumption they use the NIDD mode of communication instead. The IoT controller here requests from SCEF the IP context information and further application layer context. The SCEF here requests IP context information from the core network and application layer context from the sensors. The sensor application type is here known from the subscription type, and only one request from the sensors is needed here. The sensor provides a URL for downloading context information and the core network provides the IP context information. This information is then used for compressed communication between the sensors and the IoT controller.

Similarly, for a connect set of blood pressure sensors may report blood pressure to an IoT controller. Only one request may be needed for providing compressed communication between the sensors and the IoT controller.

A smart door lock is a further example of an IoT device that may utilize connected similarly to an application server. IoT devices may further be implemented in industrial applications such as jet engines, oil and gas equipment, power grids, locomotives, smart factories, industrial analytics, robotics, augmented reality, 3D printing, connected supply chains etc.

Figure 6:
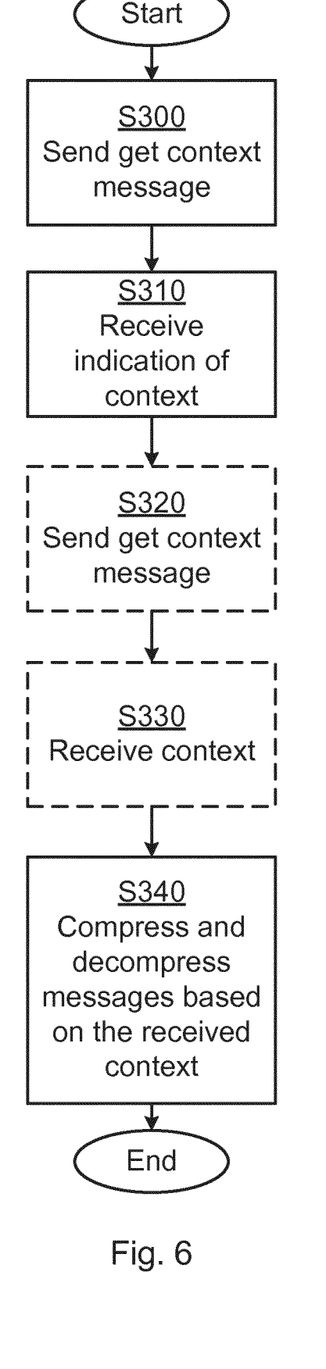

A method for enabling compression context setup for IoT devices in a communication network is presented with reference to FIG. 6. The method is performed in an application server node 3 for IoT devices, and comprises sending S300 a get context message to a gateway node 2, the get context message requesting a compression context setup comprising compression details for an IoT device 1, receiving S310 an indication of the requested compression context setup for the IoT device from the gateway node, and compressing and decompressing S340 messages sent to and from the IoT device based on the received indication.

The received indication S310 may comprise a pointer to a context storage node 4 storing compression details for the IoT device, and the method further comprises sending S320 a get context message to the context storage in response to the received indication, and receiving S330 a compression context setup for the IoT device in response to the get context message sent to the context storage. The pointer may be an URL to the context storage. The compression context setup may comprise application layer compression details for the IoT device.

The received indication S310 may comprise the requested compression context setup for the IoT device. The compression context setup may comprise IP layer compression details for the IoT device. The IP layer compression details may be retrieved from a core network node 5.

The communication network may comprise an LPWA network.

Figure 8:
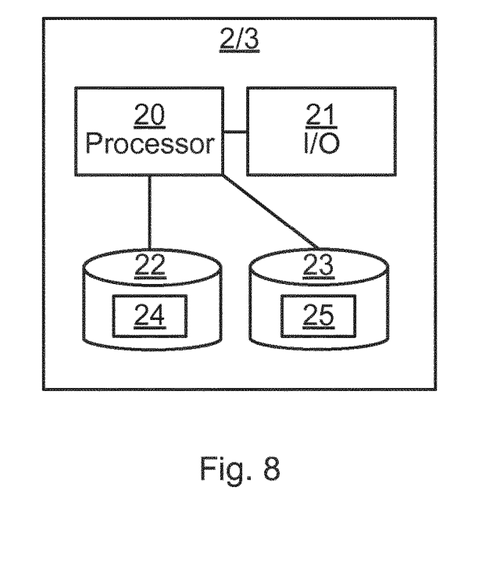

An application server node, according to an embodiment, for enabling compression context setup for IoT devices in a communication network is presented with reference to FIG. 8. The application server node 3 comprises a processing circuitry 20, and a computer program product 22, 23 storing instructions that, when executed by the processing circuitry, causes the application server node to send S300 a get context message to a gateway node 2, the get context message requesting a compression context setup comprising compression details for an IoT device 1, to receive S310 an indication of the requested compression context setup for the IoT device from the gateway node, and to compress and decompress S340 messages sent to and from the IoT device based on the received indication.

The received indication S310 may comprise a pointer to a context storage node 4 storing compression details for the IoT device, and the application server node may further be caused to send S320 a get context message to the context storage in response to the received indication, and to receive S330 a compression context setup for the IoT device in response to the get context message sent to the context storage. The pointer may be an URL to the context storage. The compression context setup may comprise application layer compression details for the IoT device.

The received indication may comprise the requested compression context setup for the IoT device. The compression context setup may comprise IP layer compression details for the IoT device. The IP layer compression details may be retrieved from a core network node 5.

The communication network may comprise an LPWA network.

FIG. 8 is a schematic diagram showing some components of the application server node 3. The processing circuitry 20 may be provided using any combination of one or more of a suitable central processing unit, CPU, multiprocessing circuitry, microcontroller, digital signal processing circuitry, DSP, application specific integrated circuit etc., capable of executing software instructions of a computer program 24 stored in a memory. The memory can thus be considered to be or form part of the computer program product 22. The processing circuitry 20 may be configured to execute methods described herein with reference to FIG. 6.

The memory may be any combination of read and write memory, RAM, and read only memory, ROM. The memory may also comprise persistent storage, which, for example, can be any single one or combination of magnetic memory, optical memory, solid state memory or even remotely mounted memory.

A second computer program product 23 in the form of a data memory may also be provided, e.g. for reading and/or storing data during execution of software instructions in the processing circuitry 20. The data memory can be any combination of read and write memory, RAM, and read only memory, ROM, and may also comprise persistent storage, which, for example, can be any single one or combination of magnetic memory, optical memory, solid state memory or even remotely mounted memory. The data memory may e.g. hold other software instructions 25, to improve functionality for the application server node 3.

The application server node 3 may further comprise an input/output (I/O) interface 21 including e.g. a user interface. The application server node 3 may further comprise a receiver configured to receive signalling from other nodes, and a transmitter configured to transmit signalling to other nodes (not illustrated). Other components of the application server node 3 are omitted in order not to obscure the concepts presented herein.

Figure 10:
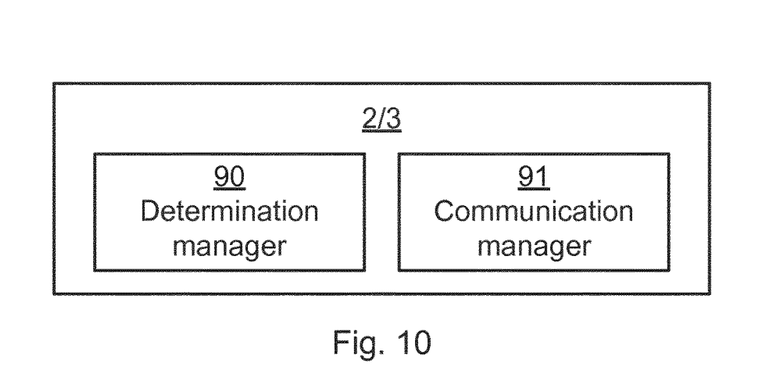

FIG. 10 is a schematic diagram showing functional blocks of the application server node 3. The modules may be implemented as only software instructions such as a computer program executing in the cache server or only hardware, such as application specific integrated circuits, field programmable gate arrays, discrete logical components, transceivers, etc. or as a combination thereof. In an alternative embodiment, some of the functional blocks may be implemented by software and other by hardware. The modules correspond to the steps in the method illustrated in FIG. 6, comprising a determination manager unit 90 and a communication manager unit 91. In the embodiments where one or more of the modules are implemented by a computer program, it shall be understood that these modules do not necessarily correspond to process modules, but can be written as instructions according to a programming language in which they would be implemented, since some programming languages do not typically contain process modules.

The determination manger 90 is for enabling compression context setup for IoT devices in a communication network. This module corresponds to the compress and decompress step S340 of FIG. 6. This module can e.g. be implemented by the processing circuitry 20 of FIG. 8, when running the computer program.

The communication manager 91 is for enabling compression context setup for IoT devices in a communication network. This module corresponds to the send step S300, the receive step S310, the send step S320, and the receive step S330 of FIG. 6. This module can e.g. be implemented by the processing circuitry 20 of FIG. 8, when running the computer program.

A computer program 24, 25, according to an embodiment, for enabling compression context setup for IoT devices in a communication network is presented with reference to FIG. 8. The computer program comprises computer program code which, when run on an application server node 3 causes the application server node to send S300 a get context message to a gateway node 2, the get context message requesting a compression context setup comprising compression details for an IoT device 1, to receive S310 an indication of the requested compression context setup for the IoT device from the gateway node, and to compress and decompress S340 messages sent to and from the IoT device based on the received indication.

Figure 4:
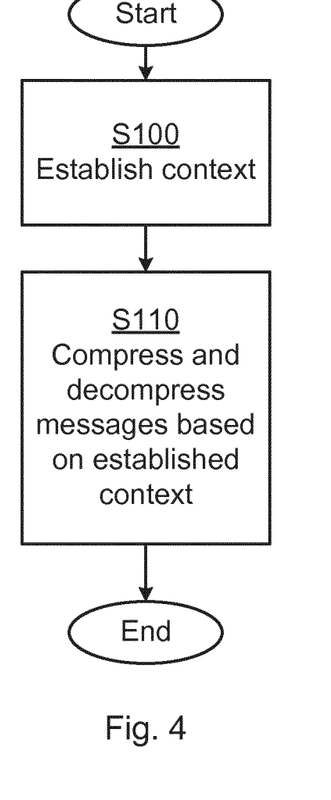
FIGS. 4-6 are flow charts illustrating methods for embodiments presented herein.

A method for enabling compression context setup for IoT devices in a communication network is presented with reference to FIG. 4. The method is performed in an IoT device 1, and comprises establishing S100 a compression context setup for the IoT device, and compressing and decompressing Silo messages sent to and from an application server 3 for IoT devices based on the established compression context setup.

The establishing S100 comprises sending a pointer to a gateway node 2, which pointer points to a context storage 4 comprising the established context setup for the IoT device. The pointer may be an URL to the context storage. The compression context setup may comprise application layer compression details for the IoT device.

The establishing S100 may comprise attaching to a core network node 5. The attaching is not compression context setup as such, it is performed for the purpose of getting IP address and other network information, but it enables the compression context setup because the network and device become aware of the IP address information. The compression context setup may comprise IP layer compression details.

The communication network may comprise an LPWA network.

Figure 7:
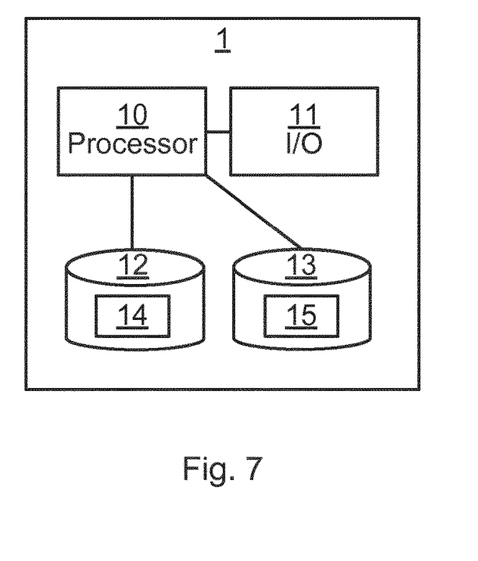
FIGS. 7-8 are schematic diagrams illustrating some components of devices presented herein.

An IoT device, according to an embodiment, for enabling compression context setup for IoT devices in a communication network is presented with reference to FIG. 7. The IoT device 1 comprises a processing circuitry 10, and a computer program product 12, 13 storing instructions that, when executed by the processing circuitry, causes the IoT device to establish S100 a compression context setup for the IoT device and to compress and decompress S110 messages sent to and from an application server 3 for IoT devices based on the established compression context setup.

The establish step may cause sending a pointer to a gateway node 2, which pointer points to a context storage 4 comprising the established context setup for the IoT device. The pointer may be an URL to the context storage. The compression context setup may comprise application layer compression details for the IoT device.

The establish step may comprise attaching to a core network node 5. The compression context setup may comprise IP layer compression details.

The communication network may comprise an LPWA network.

FIG. 7 is a schematic diagram showing some components of the IoT device 1. The processing circuitry 10 may be provided using any combination of one or more of a suitable central processing unit, CPU, multiprocessing circuitry, microcontroller, digital signal processing circuitry, DSP, application specific integrated circuit etc., capable of executing software instructions of a computer program 14 stored in a memory. The memory can thus be considered to be or form part of the computer program product 12. The processing circuitry 10 may be configured to execute methods described herein with reference to FIG. 4.

The memory may be any combination of read and write memory, RAM, and read only memory, ROM. The memory may also comprise persistent storage, which, for example, can be any single one or combination of magnetic memory, optical memory, solid state memory or even remotely mounted memory.

A second computer program product 13 in the form of a data memory may also be provided, e.g. for reading and/or storing data during execution of software instructions in the processing circuitry 10. The data memory can be any combination of read and write memory, RAM, and read only memory, ROM, and may also comprise persistent storage, which, for example, can be any single one or combination of magnetic memory, optical memory, solid state memory or even remotely mounted memory. The data memory may e.g. hold other software instructions 15, to improve functionality for the IoT device 1.

The IoT device 1 may further comprise an input/output (I/O) interface 11 including e.g. a user interface. The IoT device 1 may further comprise a receiver configured to receive signalling from other nodes, and a transmitter configured to transmit signalling to other nodes (not illustrated). Other components of the IoT device 1 are omitted in order not to obscure the concepts presented herein.

Figure 9:
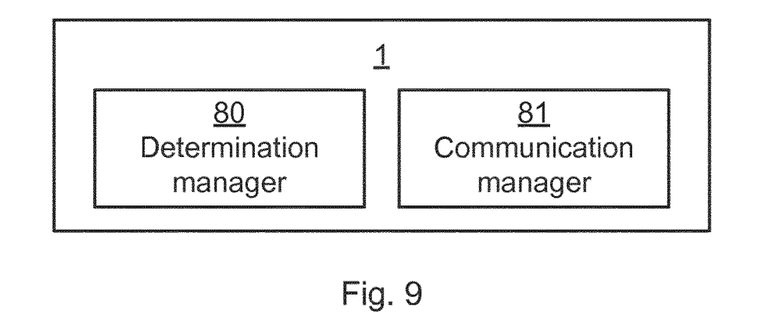
FIGS. 9-10 are schematic diagrams showing functional modules of devices presented herein.

FIG. 9 is a schematic diagram showing functional blocks of the IoT device 1. The modules may be implemented as only software instructions such as a computer program executing in the cache server or only hardware, such as application specific integrated circuits, field programmable gate arrays, discrete logical components, transceivers, etc. or as a combination thereof. In an alternative embodiment, some of the functional blocks may be implemented by software and other by hardware. The modules correspond to the steps in the method illustrated in FIG. 4, comprising a determination manager unit 80 and a communication manager unit 81. In the embodiments where one or more of the modules are implemented by a computer program, it shall be understood that these modules do not necessarily correspond to process modules, but can be written as instructions according to a programming language in which they would be implemented, since some programming languages do not typically contain process modules.

The determination manger 80 is for enabling compression context setup for IoT devices in a communication network. This module corresponds to the compress and decompress step S110 of FIG. 4. This module can e.g. be implemented by the processing circuitry 10 of FIG. 7, when running the computer program.

The communication manager 81 is for enabling compression context setup for IoT devices in a communication network. This module corresponds to the establish step S100 of FIG. 4. This module can e.g. be implemented by the processing circuitry 10 of FIG. 7, when running the computer program.

A computer program 14, 15, according to an embodiment, for enabling compression context setup for IoT devices in a communication network is presented with reference to FIG. 7. The computer program comprises computer program code which, when run on an IoT device 1, causes the IoT device to establish S100 a compression context setup for the IoT device, and to compress and decompress S110 messages sent to and from an application server 3 for IoT devices based on the established compression context setup.

Figure 5:
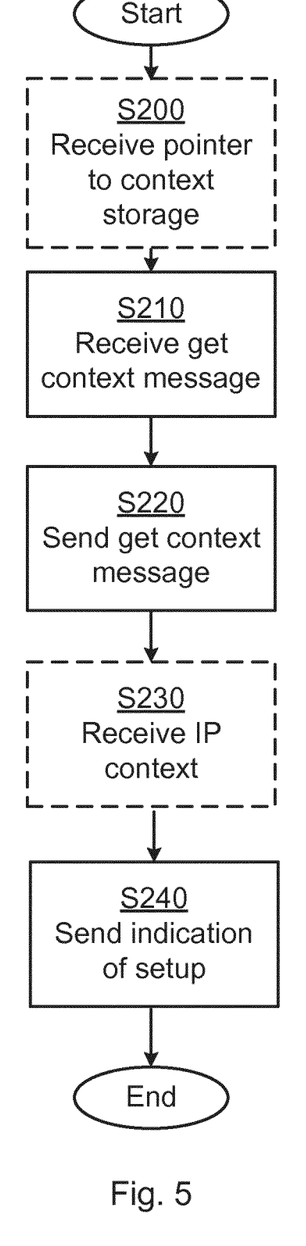

A method for enabling compression context setup for IoT devices in a communication network is presented with reference to FIG. 5. The method is performed in a gateway node 3 for IoT devices, and comprises receiving S210 a get context message from an application server node 3, the get context message requesting a compression context setup comprising compression details for an IoT device 1, and sending S240 an indication of the requested compression context setup for the IoT device to the application server node.

The received get context message may request application layer compression details for the IoT device, and the method may further comprise receiving S200 a pointer from the IoT device, wherein the pointer points to a context storage node 4 storing the application layer compression details for the IoT device.

The received get context message may request IP layer compression details for the IoT device, and the method may further comprise sending S220 a get context message to a core network node 5, and receiving S230 IP layer compression details for the IoT device in response to the sent get context message, and wherein the sent indication comprises the received IP layer compression details.

The communication network may comprise an LPWA network.

A gateway node, according to an embodiment, for enabling compression context setup for IoT devices in a communication network is presented with reference to FIG. 8. The gateway node 3 comprises a processing circuitry 20, and a computer program product 22, 23 storing instructions that, when executed by the processing circuitry, causes the gateway node to receive S210 a get context message from an application server node 3, the get context message requesting a compression context setup comprising compression details for an IoT device 1, and to send S240 an indication of the requested compression context setup for the IoT device to the application server node.

The received get context message may request application layer compression details for the IoT device, and the gateway node may further be caused to receive S200 a pointer from the IoT device, wherein the pointer points to a context storage node 4 storing the application layer compression details for the IoT device. The received get context message may request IP layer compression details for the IoT device, and the gateway node may further be caused to send S220 a get context message to a core network node 5, and to receive S230 IP layer compression details for the IoT device in response to the sent get context message, wherein the sent indication comprises the received IP layer compression details.

The communication network may comprise an LPWA network.

FIG. 8 is a schematic diagram showing some components of the gateway node 2, details of which has been described above in connection with the application server node 3. The processing circuitry 20 may here be configured to execute methods described herein with reference to FIG. 5.

FIG. 10 is a schematic diagram showing functional blocks of the gateway node 2, details of which has been described above in connection with the application server node 3. The modules here correspond to the steps in the method illustrated in FIG. 5.

The communication manager 91 is here for enabling compression context setup for IoT devices in a communication network. This module here corresponds to the send step S200, the receive step S210, the send step S220, the receive step S230, and the send step S240 of FIG. 5. This module can e.g. be implemented by the processing circuitry 20 of FIG. 8, when running the computer program.

A computer program 24, 25, according to an embodiment, for enabling compression context setup for IoT devices in a communication network is presented with reference to FIG. 8. The computer program comprises computer program code which, when run on a gateway node 3, causes the gateway node to receive S210 a get context message from an application server node 3, the get context message requesting a compression context setup comprising compression details for an IoT device 1, and to send S240 an indication of the requested compression context setup for the IoT device to the application server node.

A computer program product comprising a computer program described above and a computer readable storage means on which the computer program is stored is also presented.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A method of operating an application server node for Internet-of-Thing ("IoT") devices to enable compression context setup for the IoT devices, the method comprising:
    transmitting a get context message to a gateway node in a Low Power Wide Area ("LPWA") network that includes the application server node and the IoT devices, the get context message requesting a compression context setup comprising compression details for an IoT device of the IoT devices, the compression context setup comprising at least one of:
        application layer compression details for the IoT device; and
        Internet Protocol ("IP") layer compression details for the IoT device;
    receiving an indication of the compression context setup for the IoT device from the gateway node, the indication comprises a pointer to a context storage node storing compression details for the IoT device; and
    compressing or decompressing a message communicated with the IoT device based on the indication.

2. The method of claim 1, wherein the get context message is a first get context message,
    the method further comprising:
        responsive to receiving the indication, transmitting a second get context message to the context storage node; and
        responsive to transmitting the second get context message, receiving the compression context setup for the IoT device from the context storage node.

3. The method of claim 1, wherein the pointer is a Uniform Resource Locator ("URL") to the context storage.

4. The method of claim 1, wherein the compression context setup comprises application layer compression details for the IoT device.

5. The method of claim 1, wherein the compression context setup comprises Internet Protocol ("IP") layer compression details for the IoT device.

6. The method of claim 5, wherein the IP layer compression details are retrieved from a core network node.

7. An application server node for enabling compression context setup for Internet-of-Thing ("IoT") devices, the application server node comprising:
    processing circuitry; and
    a memory coupled to the processing circuitry and having instructions stored therein that are executable by the processing circuitry to cause the application server node to perform operations comprising:
        transmitting a get context message to a gateway node in a Low Power Wide Area ("LPWA") network that includes the application server node and the IoT devices, the get context message requesting a compression context setup comprising compression details for an IoT device of the IoT devices, the compression context setup comprising at least one of:
            application layer compression details for the IoT device; and
            Internet Protocol ("IP") layer compression details for the IoT device;
        receiving an indication of the compression context setup for the IoT device from the gateway node, the indication comprises a pointer to a context storage node storing compression details for the IoT device; and
        compressing or decompressing a message communicated with the IoT device based on the indication.

8. The application server node of claim 7, wherein the get context message is a first get context message,
    the operations further comprising:
        responsive to receiving the indication, transmitting a second get context message to the context storage node; and
        responsive to transmitting the second get context message, receiving the compression context setup for the IoT device from the context storage node.

9. The application server node of claim 7, wherein the pointer is a Uniform Resource Locator ("URL") to the context storage.

10. The application server node of claim 7, wherein the compression context setup comprises application layer compression details for the IoT device.

11. The application server node of claim 7, wherein the compression context setup comprises Internet Protocol ("IP") layer compression details for the IoT device.

12. The application server node of claim 11, wherein the IP layer compression details are retrieved from a core network node.

13. A non-transitory computer readable medium having instructions stored therein that are executable by processing circuitry in an application server node for Internet-of-Thing ("IoT") devices to cause the application server node to perform operations to enable compression context setup for the IoT devices, the operations comprising:
    transmitting a get context message to a gateway node in a Low Power Wide Area ("LPWA") network that includes the application server node and the IoT devices, the get context message requesting a compression context setup comprising compression details for an IoT device of the IoT devices, the compression context setup comprising at least one of:
        application layer compression details for the IoT device; and
        Internet Protocol ("IP") layer compression details for the IoT device;
    receiving an indication of the compression context setup for the IoT device from the gateway node, the indication comprises a pointer to a context storage node storing compression details for the IoT device; and
    compressing or decompressing a messages communicated with the IoT device based on the indication.

14. The non-transitory computer readable medium of claim 13, wherein the get context message is a first get context message,
    the operations further comprising:
        responsive to receiving the indication, transmitting a second get context message to the context storage node; and
        responsive to transmitting the second get context message, receiving the compression context setup for the IoT device from the context storage node.

15. The non-transitory computer readable medium of claim 13, wherein the pointer is a Uniform Resource Locator ("URL") to the context storage.

16. The non-transitory computer readable medium of claim 13, wherein the compression context setup comprises application layer compression details for the IoT device.

17. The non-transitory computer readable medium of claim 13, wherein the compression context setup comprises Internet Protocol ("IP") layer compression details for the IoT device.

18. The non-transitory computer readable medium of claim 17, wherein the IP layer compression details are retrieved from a core network node.

* * * * *